(12) United States Patent
Yamada et al.

(10) Patent No.: US 8,384,052 B2
(45) Date of Patent: Feb. 26, 2013

(54) ELECTRON BEAM LITHOGRAPHY APPARATUS AND ELECTRON BEAM LITHOGRAPHY METHOD

(75) Inventors: Akio Yamada, Tokyo (JP); Masaki Kurokawa, Tokyo (JP)

(73) Assignee: Advantest Corp., Tokyo (JP)

( * ) Notice: Subject to any disclaimer, the term of this patent is extended or adjusted under 35 U.S.C. 154(b) by 103 days.

(21) Appl. No.: 12/927,180

(22) Filed: Nov. 9, 2010

(65) Prior Publication Data

US 2011/0057114 A1    Mar. 10, 2011

Related U.S. Application Data

(63) Continuation of application No. PCT/JP2008/058617, filed on May 9, 2008.

(51) Int. Cl.
*H01L 21/027* (2006.01)
(52) U.S. Cl. .................. 250/492.3; 250/492.1
(58) Field of Classification Search ..... 250/492.1–492.3
See application file for complete search history.

(56) References Cited

U.S. PATENT DOCUMENTS

| | | |
|---|---|---|
| 2003/0071231 A1 | 4/2003 | Haraguchi et al. |
| 2006/0076508 A1 | 4/2006 | Nakasugi et al. |
| 2006/0214117 A1 | 9/2006 | Yamada |
| 2007/0023689 A1 | 2/2007 | Iizuka et al. |
| 2008/0011965 A1 | 1/2008 | Matsukawa et al. |

FOREIGN PATENT DOCUMENTS

| | | |
|---|---|---|
| JP | 62-181426 | 8/1987 |
| JP | 07-074071 | 3/1995 |
| JP | 09-293473 | 11/1997 |
| JP | 09-320960 | 12/1997 |
| JP | 10-261557 | 9/1998 |
| JP | 11-219679 | 8/1999 |
| JP | 2001-196296 | 7/2001 |
| JP | 2003-124096 | 4/2003 |
| JP | 2004-088071 | 3/2004 |
| JP | 2006-032616 | 2/2006 |
| JP | 2006-114599 | 4/2006 |
| JP | 2007-043083 | 2/2007 |

OTHER PUBLICATIONS

Office action for counterpart Japanese application by Japanese Patent Office and its English translation.

*Primary Examiner* — Michael Maskell
(74) *Attorney, Agent, or Firm* — Muramatsu & Associates

(57) ABSTRACT

An electron beam lithography apparatus includes an electron gun emitting an electron beam, a deflector deflecting the electron beam, a focus corrector correcting a focus of the electron beam, a storage unit storing exposure data, and a controller correcting the exposure data based on a constant correction coefficient independent of time passage and a fluctuating correction coefficient changing with time, calculates a deflection efficiency indicating a relation between an input signal to the deflector and an amount of beam deflection, and a correction intensity indicating a relation between an input signal to the focus corrector and a beam focus, and writes the electron beam on a sample according to the deflection efficiency and the correction intensity.

6 Claims, 8 Drawing Sheets

ELECTRON BEAM LITHOGRAPHY APPARATUS AND ELECTRON BEAM LITHOGRAPHY METHOD

CROSS-REFERENCE TO RELATED APPLICATIONS

This application is a continuation of prior International Patent Application No. PCT/JP2008/058617, filed May 9, 2008, the entire contents of which are incorporated herein by reference.

BACKGROUND OF THE INVENTION

1. Field of the Invention

The present invention relates to an electron beam lithography apparatus and an electron beam lithography method, and particularly to an electron beam lithography apparatus and an electron beam lithography method which are capable of performing highly-accurate exposure continuously for a long time after execution of calibration.

2. Description of the Prior Art

To improve throughput, an electron beam exposure apparatus, which is a representative example of an electron beam lithography apparatus, has a stencil mask with a variable rectangular aperture or multiple stencil mask patterns prepared, makes a pattern selection through beam deflection, and exposes a semiconductor wafer with an electron beam to transfer the pattern thereto.

As such an exposure apparatus, Japanese Patent Application Publication No. 2004-88071, for example, discloses an electron beam exposure apparatus which performs character projection exposure. In character projection exposure, a pattern region having a size of, for example, 20×20 μm is selected through beam deflection from multiple, for example one hundred, stencil patterns placed on a mask, and an electron beam is applied to the pattern region, so that a cross section of the beam is shaped into the form of the pattern. The beam having passed through the mask is deflected back by a deflector at a later stage, then is reduced at a certain reduction ratio determined by an electron optical system, for example, at a reduction ratio of 1/10, and is transferred to a sample such as a wafer. The area on the sample irradiated at once is, for example, 2×2 μm. If the stencil patterns on the mask are appropriately prepared according to a device pattern for exposure, having such multiple stencil patterns can contribute to a drastic reduction in the number of necessary exposure shots, and thus can improve throughput much higher than a case having only a variable rectangular aperture.

Further, there is proposed a multi-column electron beam exposure apparatus which includes multiple small-sized columns (referred to as column cells below) of such exposure apparatuses and performs exposure processing in parallel using the multiple column cells arranged above a wafer. Each column cell is equivalent to the column of an electron beam exposure apparatus with a single column. Since the multi-column electron beam exposure apparatus as a whole performs the exposure processing in parallel, exposure throughput can be multiplied by the number of columns.

Such an electron beam exposure apparatus has exposure data defining which pattern to use to expose which position on a sample. Signals to be applied to a deflector and a focus corrector for pattern exposure are determined according to the exposure data. Accurate electron-beam irradiation according to the exposure data is required as a precondition for improving throughput of the exposure processing of the electron beam exposure apparatus.

However, even when the electron-beam irradiation is performed by applying signals determined according to the exposure data to the deflector and the focus corrector, a phenomenon called a drift occurs in which the position of electron beam irradiation or the convergence (focus) by electromagnetic lenses changes with time.

This drift is affected strongly by the environment in which the exposure apparatus is used, particularly, by fluctuation in air pressure, and is thought to be very difficult to control. To solve this problem, Japanese Unexamined Patent Application Publication No. Sho 62-181426 describes a technique for making disturbance factors such as an air pressure and a temperature constant, the disturbance factors adversely affecting the optical performances in a projection optical apparatus.

Further, the electron beam exposure apparatus usually performs calibration at predetermined time intervals to keep the exposure accuracy high.

However, since the air pressure and the like change also after the calibration, it is difficult to perform highly-accurate exposure for a long time after the calibration. Moreover, frequent calibrations for keeping the exposure accuracy high lower the throughput of the exposure processing.

SUMMARY OF THE INVENTION

The present invention has been made in consideration of the problems of the above conventional techniques, and has an objective of providing an electron beam lithography apparatus and an electron beam lithography method which are capable of performing highly-accurate exposure processing continuously for a long time after execution of calibration.

The above problems are solved by an electron beam lithography apparatus including: a sample chamber having a wafer stage on which a write target sample is placed; and an electron beam optical barrel configured to irradiate the sample with an electron beam, the electron beam lithography apparatus comprising: an electron gun configured to emit the electron beam; a deflector configured to deflect the electron beam; a focus corrector configured to correct a focus of the electron beam; a storage unit configured to store exposure data; and a controller configured to correct the exposure data based on a constant correction coefficient independent of time passage and a fluctuating correction coefficient changing with time, thereby calculating a deflection efficiency indicating a relation between an input signal to the deflector and an amount of beam deflection, and a focus correction intensity indicating a relation between an input signal to the focus corrector and a beam focus, and to write the electron beam on the sample according to the deflection efficiency and the focus correction intensity.

The electron beam lithography apparatus according to this aspect may further comprise a measurer configured to measure fluctuation factor data of a factor affecting operation of the electron beam lithography apparatus. The constant correction coefficient is determined according to a write position on the sample or a position of a character projection (CP) pattern to be selected, and is stored in a storage area of the storage unit, the storage area being specified by an address of the write position on the sample or the position of the CP pattern. The fluctuating correction coefficient is determined according to a value of the fluctuation factor data measured by the measurer, and the storage unit may store a correspondence between the value of the fluctuation factor data and the fluctuating correction coefficient.

Moreover, in the electron beam lithography apparatus according to this aspect, the controller may extract the constant correction coefficient corresponding to an irradiation position designated in the exposure data, extract the fluctuating correction coefficient according to the fluctuation factor data measured by the measurer, calculate a correction coefficient for the exposure data through addition or subtraction of the constant correction coefficient and the fluctuating correction coefficient, and thus calculate the deflection efficiency and the focus correction intensity. In addition, in the electron beam lithography apparatus according to this aspect, the measurer may be at least one of a barometer, a thermometer, a voltmeter, and an ammeter, and the fluctuation factor data may be at least one of an air pressure value measured by the barometer, a temperature measured by the thermometer, an accelerating voltage value measured by the voltmeter, and a lens current value measured by the ammeter.

In the present invention, the electron beam exposure apparatus takes a correction coefficient independent of time passage (a constant correction coefficient) and a correction coefficient which changes with time (a fluctuating correction coefficient) into consideration in correcting exposure data. Specifically, exposure data is corrected during the execution of exposure processing by using an integrated correction coefficient of the constant correction coefficient and the fluctuating correction coefficient. The constant correction coefficient is a correction coefficient according to the sample exposure position or, in the case of character projection, the position of a CP pattern. The fluctuating correction coefficient is a correction coefficient determined according to, for example, fluctuation in air pressure or temperature around the apparatus.

By cancelling irradiation position fluctuation due to air pressure fluctuation or temperature fluctuation by using the fluctuating correction coefficient, electron-beam irradiation can be performed with high accuracy continuously for a long time after execution of calibration.

Moreover, another aspect of the present invention provides an electron beam lithography method implemented in the electron beam lithography apparatus according to the above aspect. The electron beam lithography method is conducted in an electron beam lithography apparatus including an electron gun configured to emit an electron beam, a deflector configured to deflect the electron beam, a focus corrector configured to correct a focus of the electron beam, and a storage unit configured to store exposure data. The electron beam lithography method comprising the steps of: before starting writing, measuring a constant correction coefficient for the exposure data and storing the constant correction coefficient in the storage unit, the constant correction coefficient being independent of time passage; extracting exposure data from the storage unit; extracting from the storage unit a constant correction coefficient corresponding to the exposure data extracted; calculating a fluctuating correction coefficient for the exposure data during the writing, the fluctuating correction coefficient changing with time; and calculating a deflection efficiency of the deflector and a focus correction intensity of the focus corrector based on the constant correction coefficient and the fluctuating correction coefficient, and exposing the sample with the electron beam according to the deflection efficiency and the focus correction intensity.

DESCRIPTION OF THE PREFERRED EMBODIMENTS

An embodiment of the present invention is described below with reference to the drawings. In the present embodiment, a multi-column electron beam exposure apparatus is described as an example of an electron beam lithography apparatus. First, with reference to FIGS. 1 to 3, the configuration of the multi-column electron beam exposure apparatus is described. Next, with reference to FIGS. 4 to 7, how to handle air pressure fluctuation is described. Next, with reference to FIG. 8, an electron beam exposure method is described as an example of an electron beam lithography method.
(Configuration of Main Body of Multi-Column Electron Beam Exposure Apparatus)

Figure 1:
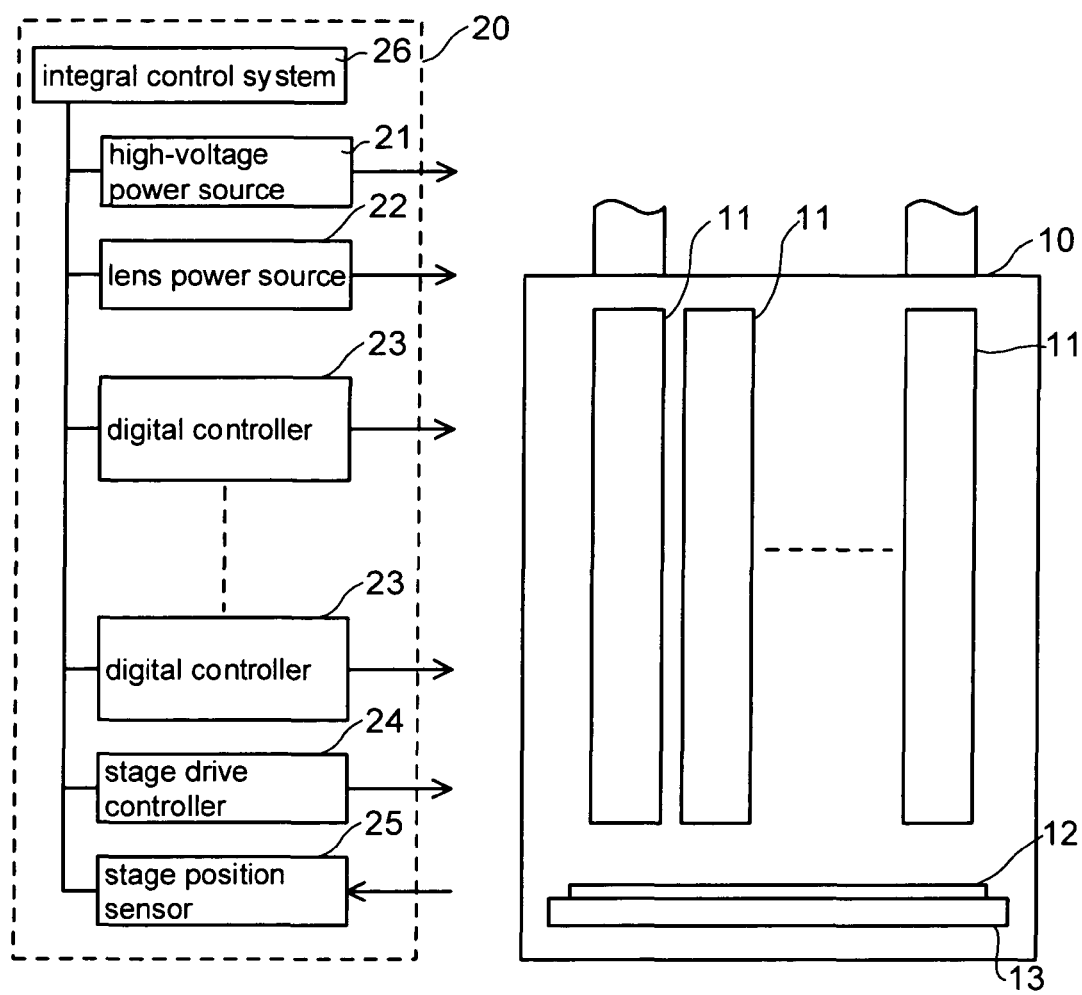
FIG. 1 is a configuration diagram of a multi-column electron beam exposure apparatus.

FIG. 1 is a schematic configuration diagram of the multi-column electron beam exposure apparatus according to the present embodiment.

The multi-column electron beam exposure apparatus roughly includes an electron beam column 10 and a controller 20 which controls the electron beam column 10. The electron beam column 10 is configured with multiple, for example sixteen column cells 11. All the column cells 11 are configured similarly with units to be described later. A wafer stage 13 on which a wafer (sample) 12 of, for example, 300 mm is mounted is placed under the column cells 11.

The controller 20 has an electron-gun high-voltage power source 21, a lens power source 22, digital controllers 23, a stage drive controller 24, and a stage position sensor 25. The electron-gun high-voltage power source 21 supplies power for driving an electron gun of each column cell 11 in the electron beam column 10. The lens power source 22 supplies power for driving electromagnetic lenses of each column cell 11 in the electron beam column 10. The digital controllers 23 arc each being an electric circuit for controlling the units of a corresponding one of the column cells 11, and outputs a high-speed deflection output and the like. The digital controllers 23 are prepared as many as the number of the column cells 11.

The stage drive controller 24 moves the wafer stage 13 based on position information from the stage position sensor 25 so that a desired position on the wafer 12 can be irradiated with an electron beam. The units 21 to 25 described above are integrally controlled by an integral control system 26 such as a workstation.

Figure 2:
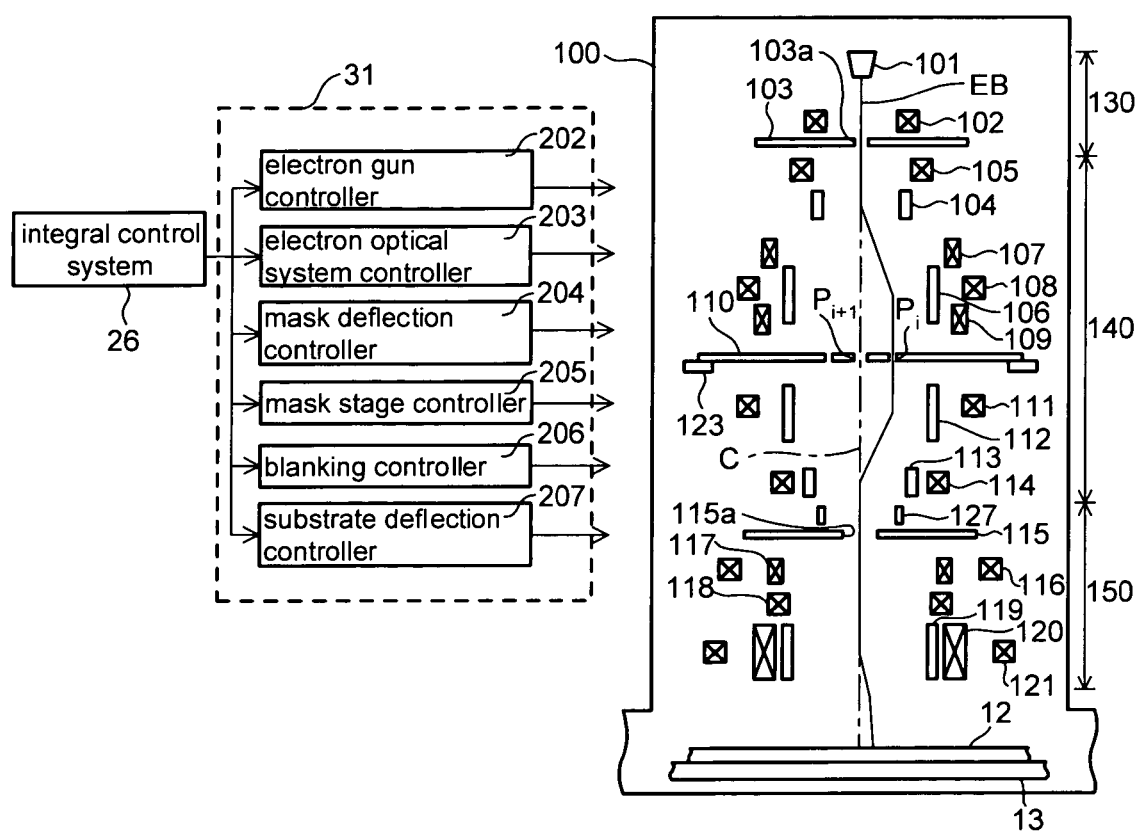
FIG. 2 is a configuration diagram of one of column cells of the exposure apparatus in FIG. 1.

In the above-described multi-column electron beam exposure apparatus, the column cells 11 are all configured of the same units. FIG. 2 is a schematic configuration diagram of each column cell 11 in FIG. 1 used in the multi-column electron beam exposure apparatus.

Each column cell 11 roughly includes an exposure unit 100 and a column cell controller 31 which controls the exposure unit 100. The exposure unit 100 includes an electron beam generation section 130, a mask deflection section 140, and a substrate deflection section 150.

In the electron beam generation section 130, an electron beam EB generated by an electron gun 101 is converged by first electromagnetic lenses 102, and then passes through a rectangular aperture 103a of a beam shaping mask 103 so that the cross section of the electron beam EB may be shaped into a rectangle.

Thereafter, an image of the electron beam EB is formed on an exposure mask 110 by second electromagnetic lenses 105 in the mask deflection section 140. Then, the electron beam EB is deflected by first and second sets of electrostatic deflectors 104 and 106 to a particular pattern P formed in the exposure mask 110 to have the cross section thereof shaped into the form of the pattern P. This pattern is also referred to as a character projection (CP) pattern.

The exposure mask 110 is fixed to a mask stage 123, and the mask stage 123 is movable on the horizontal plane. Accordingly, when the pattern P to be used is located out of a deflection range (a beam deflection region) of the first and second electrostatic deflectors 104 and 106, the pattern can be moved into the beam deflection region by moving the mask stage 123.

Third and fourth sets of electromagnetic lenses 108 and 111 placed above and below the exposure mask 110, respectively, each plays a role of forming an image of the electron beam EB on a substrate by adjusting an amount of current passing therethrough.

After passing through the exposure mask 110, the electron beam EB is deflected back to an optic axis C by third and fourth sets of electrostatic deflectors 112 and 113, and is then reduced in size by fifth electromagnetic lenses 114.

The mask deflection section 140 is provided with first and second sets of correction coils 107 and 109 by which to correct beam deflection aberrations generated in the first to fourth electrostatic deflectors 104, 106, 112, and 113.

Thereafter, the electron beam EB passes through an aperture 115a of a masking shield 115 arranged in the substrate deflection section 150, and is projected on the substrate (wafer 12) by first and second sets of projection electromagnetic lenses 116 and 121. Thus, an image of the pattern of the exposure mask 110 is transferred onto the substrate at a predetermined reduction ratio, for example, 1/10.

The substrate deflection section 150 includes fifth electrostatic deflectors 119 and electromagnetic deflectors 120 by which the electron beam EB is deflected to project an image of the pattern of the exposure mask 110 at a predetermined position on the substrate.

The substrate deflection section 150 is further provided with third and fourth sets of correction coils 117 and 118 for correcting deflection aberrations of the electron beam EB on the substrate.

The column cell controller 31 includes an electron gun controller 202, an electron optical system controller 203, a mask deflection controller 204, a mask stage controller 205, a blanking controller 206, and a substrate deflection controller 207. The electron gun controller 202 controls the electron gun 101 with respect to an acceleration voltage, beam radiation conditions, and the like of the electron beam EB. The electron optical system controller 203 controls an amount of current or the like to each of the electromagnetic lenses 102, 105, 108, 111, 114, 116, and 121 to adjust the magnification, the focus position, and the like of an electron optical system including these electromagnetic lenses. The blanking controller 206 controls a voltage applied to a blanking electrode 127 to deflect the electron beam EB generated before start of exposure onto the masking shield 115 so that the substrate may not be irradiated with the electron beam EB before exposure.

The substrate deflection controller 207 controls a voltage applied to the fifth electrostatic deflectors 119 and an amount of current to the electromagnetic deflectors 120 to deflect the electron beam EB onto a predetermined position on the substrate. The units 202 to 207 are integrally controlled by the integral control system 26 such as a workstation.

Figure 3:
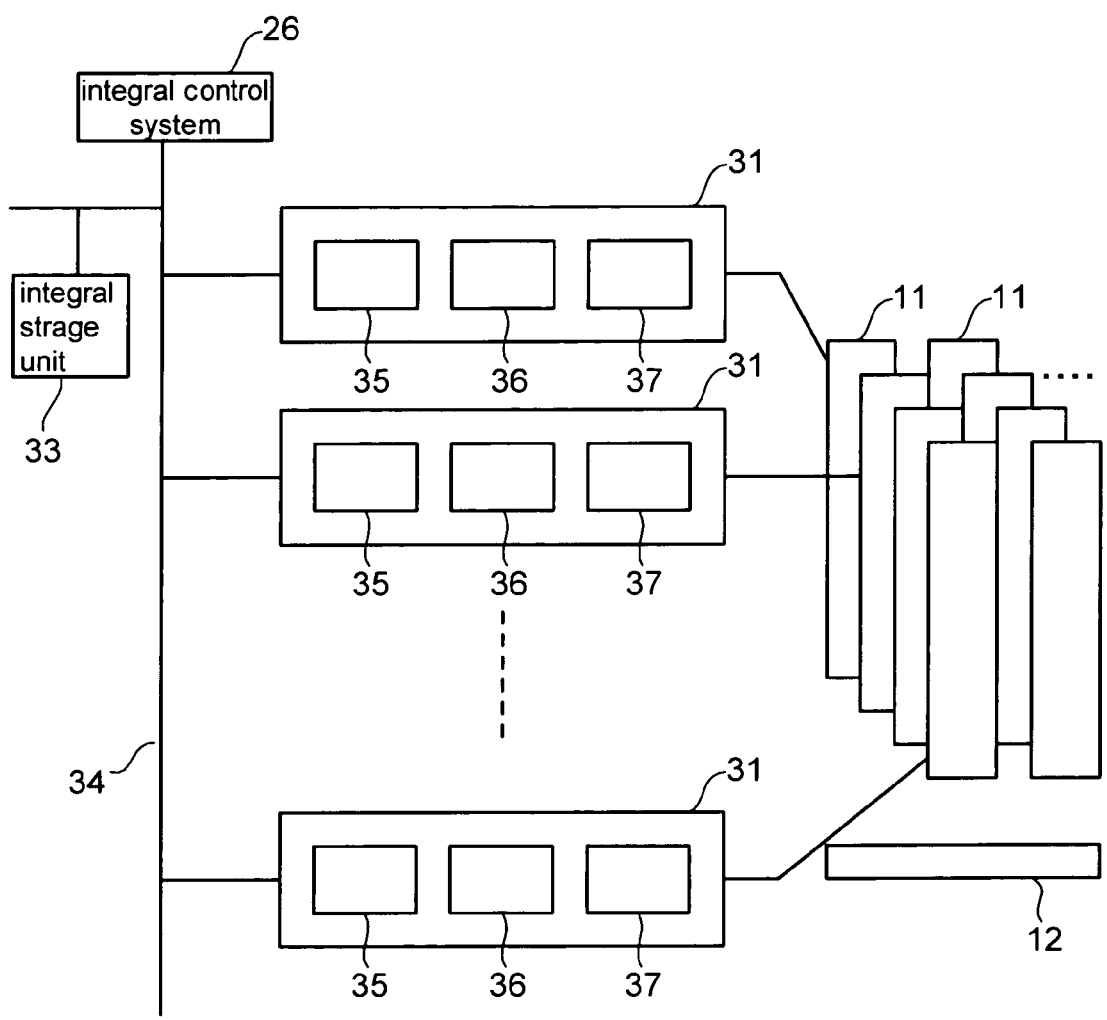
FIG. 3 is a schematic diagram of a column cell controller of the exposure apparatus in FIG. 1.

FIG. 3 is a schematic diagram of the column cell controller 31 of the multi-column electron beam exposure apparatus. Each column cell 11 has its own column cell controller 31. Each column cell controller 31 is connected through a bus 34 to the integral control system 26 which performs integral control of the multi-column electron beam exposure apparatus. Further, an integral storage unit 33 is configured with a hard disk for example, and stores data, such as exposure data, needed by all of the column cells 11. The integral storage unit 33, too, is connected to the integration control system 26 through the bus 34.

In the multi-column electron beam exposure apparatus thus configured, exposure data indicating a pattern to be transferred by exposure to the wafer 12 placed on the wafer stage 13 is passed from the integral storage unit 33 to a column cell storage unit 35 of each column cell controller 31. The exposure data thus passed is corrected by a corrector 36 of each column cell controller 31, and is converted by an exposure data converter 37 into data actually needed for exposure processing. Then, each column cell 11 transfers a pattern to an exposure region on the wafer assigned thereto. Particularly, in the present embodiment, as is described later, the exposure data is corrected by being subjected to a correction for an influence dependent on an irradiation position and to a correction for an influence by an air pressure, a temperature, and the like, thereby determining signals to be applied to electrodes of the deflectors and the like. The exposure processing is performed based on the signals thus determined.

Next, a description is given of exposure-data correction processing taking the influence by environmental fluctuation such as air pressure fluctuation, temperature fluctuation, and the like, into consideration. Note that the following description is mainly directed to an example of an air pressure as the environmental fluctuation.

Figure 4A:
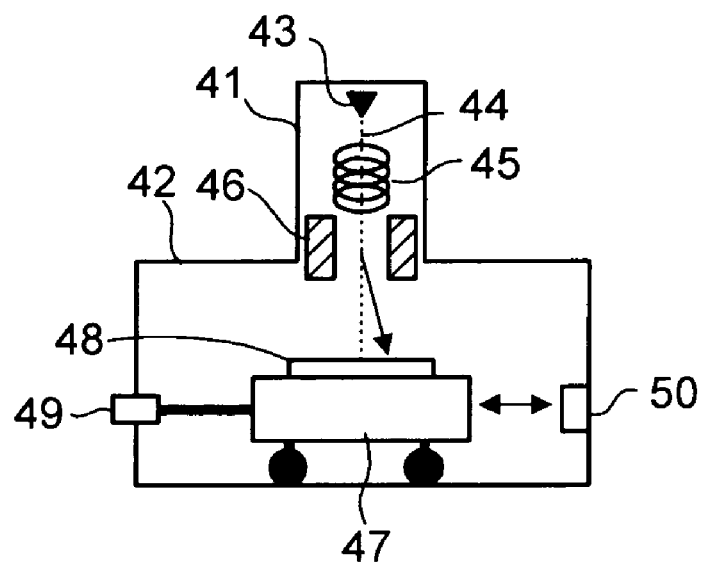
FIGS. 4A and 4B are diagrams illustrating how the exposure apparatus is affected when a pressure fluctuates.
Figure 4B:
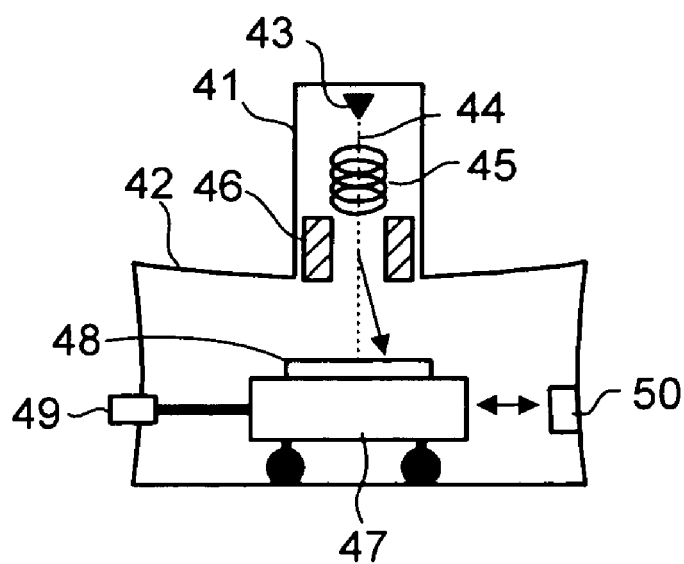

FIGS. 4A and 4B show the electron beam column 10 including an electron beam optical lens barrel 41 and a sample chamber 42, and show a case where there is a single column cell 11. FIG. 4A shows the electron beam column 10 under a standard air pressure, whereas FIG. 4B schematically shows how the electron beam column 10 is affected when the air pressure becomes higher than the standard pressure, when a high pressure is applied on the electron beam column 10.

In FIGS. 4A and 4B, a correction coil 45 performs focus correction for irradiating a desired position on a sample 48 placed on a stage 47 with an electron beam 44 emitted from an electron gun 43, and a deflector 46 deflects the electron beam 44. Further, a stage drive unit 49 is driven to move the stage 47 to a predetermined position while detecting the stage position with a laser length measurer 50.

When the air pressure becomes higher than the standard air pressure by, for example, 10 hpa, a force of about 102 kgf/m$^2$ is exerted. As shown in FIG. 4B, when the top part of the sample chamber 42 is moved downward by this force, the position of the electron beam optical lens barrel 41 placed above the sample chamber 42 also moves downward. This causes an imaging focus by the correction coil 45 to shift and deflection efficiency of the deflector 46 to change. Accordingly, even if electron beam irradiation is performed accordingly to exposure data, an irradiation position shift occurs.

The inventors have focused attention on the following to avoid such degradation in exposure accuracy due to air pressure fluctuation. Specifically, a fluctuation amount is corrected through quantitative definition of accuracy degradation due to the air pressure fluctuation, such as fluctuation in exposure position and fluctuation in deflection efficiency. To be more specific, how an exposure position fluctuates due to air pressure fluctuation is measured in advance, and a relation between the air pressure fluctuation and the fluctuation in the beam irradiation position is recorded. Then, exposure data is corrected according to air pressure fluctuation occurring during execution of the exposure processing.

Figure 5:
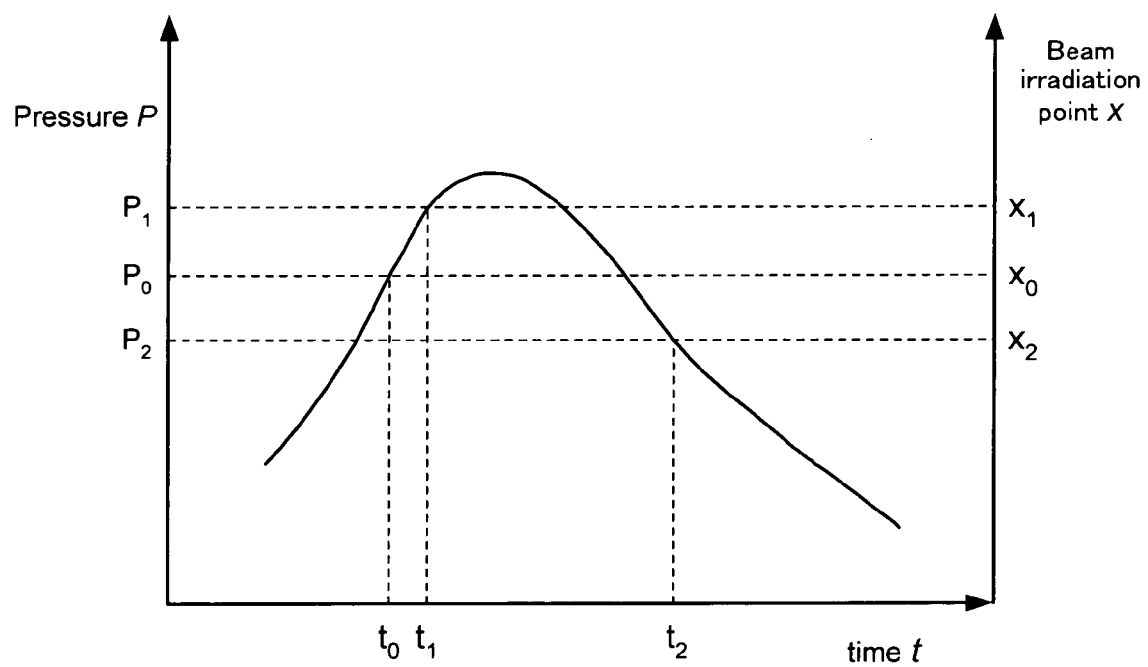
FIG. 5 is a diagram showing how an air pressure and an irradiation position change with time.

FIG. 5 is a diagram showing how a beam irradiation position on a write target sample fluctuates due to air pressure fluctuation which occurs with time even if the write target sample is stopped at the same position on the stage. In FIG. 5, the irradiation position changes between positions in an x direction, as an example. As FIG. 5 shows, a position irradiated at the time of an air pressure $P_0$ is $x_0$, the air pressure $P_0$ being a standard air pressure. The irradiation position changes with a change in an air pressure. For example, when the air pressure changes from $P_0$ to $P_1$, the irradiation position changes from $x_0$ to $x_1$, and when the air pressure changes from $P_1$ to $P_2$, the irradiation position changes from $x_1$ to $x_2$. In this way, the air pressure changes with time. Accordingly, in the exposure apparatus receiving an influence by air pressure fluctuation, even if a relation between exposure conditions of the exposure apparatus and a beam irradiation position of the write target sample is calibrated at a certain point of time, the relation changes due to air pressure fluctuation after the calibration. It is therefore difficult to irradiate a correct position until the next calibration. When accuracy in the irradiation position is required and an acceptable error range is small, the calibration needs to be conducted frequently by shortening the intervals between calibrations. This causes a problem of a decrease in exposure throughput.

A description is given below of how to obtain an exposure-data correction coefficient including a correction for such an influence by air pressure fluctuation.

Figure 6:
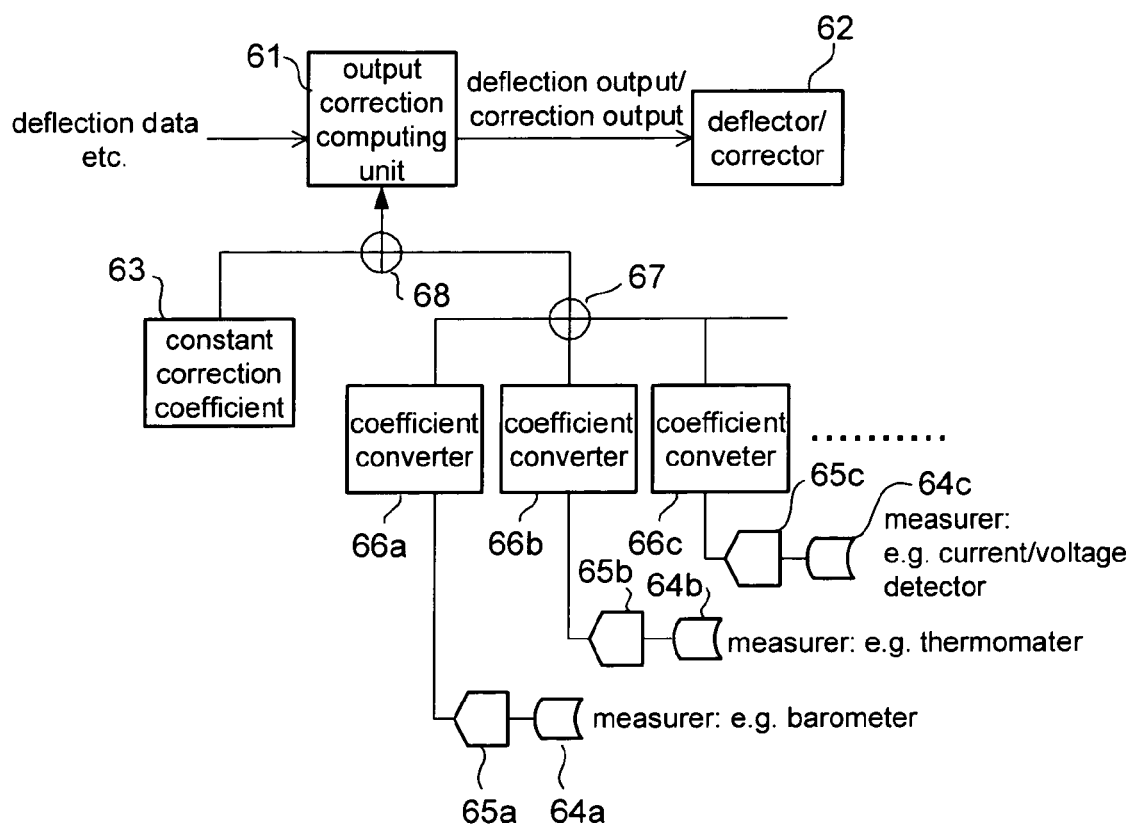
FIG. 6 is a diagram illustrating how to obtain a correction coefficient for exposure data in the electron beam exposure apparatus.

FIG. 6 is a diagram illustrating how to obtain an exposure-data correction coefficient in the electron beam exposure apparatus.

When the shape of a pattern transferred to a sample is a variable rectangle for example, deflection data or the like which indicates an electron beam irradiation position including lengths in the x and y directions is defined in exposure data stored in the integral storage unit 33. An output correction computing unit 61 receives such exposure data on one-shot basis, and corrects the exposure data so that a position designated by the exposure data may be irradiated with an electron beam or so that a CP pattern designated may be selected, thereby determining signals (a deflection output and a correction output) to be applied to a deflector/corrector (focus corrector) 62.

In the present embodiment, a constant correction coefficient 63 and a fluctuating correction coefficient are used for the correction of the exposure data. The constant correction coefficient 63 depends on a write position on the sample or a stage position and does not change with time, and the fluctuating correction coefficient changes with time, including an irradiation position shift or the like due to an environmental change such as a change in air pressure or in temperature, or a change in accelerating voltage.

The fluctuating correction coefficient is determined as follows. Under the conditions where the write position on the sample or the stage position, or the CP pattern to be selected is set constant, fluctuation in the beam irradiation position is measured for a certain period of time using a mark detection method using an electron beam. An air pressure is measured during the same period of time. The fluctuation in the air pressure and the fluctuation in the beam irradiation position are compared to each other, and a relation between the beam irradiation position fluctuation and the air pressure fluctuation in a portion having a correlation therebetween is determined as the fluctuating correction coefficient. Further, the constant correction coefficient is determined as follows. With a correction by the above-described fluctuating correction coefficient being made, a difference between a target beam irradiation position and an actual beam irradiation position is measured using a mark detection method using an electron beam while the write position on the sample or the stage position is changed, or the CP pattern selected is changed. Depending on the write position on the sample or the stage position, or the CP pattern selected, a difference between the target position and the actual irradiation position occurs. According to the difference between the target position and the actual irradiation position, the relation with the write position on the sample, the stage position, or the CP pattern selected, and beam irradiation position is determined as the constant correction coefficient.

Data for determining the fluctuating correction coefficient is obtained as follows. A measurer 64 measures data on fluctuation factors affecting the operation of the exposure apparatus, and a coefficient converter 66 performs conversion into a correction coefficient according to the fluctuation factor data. In FIG. 6, as an example, an air pressure, a temperature, a voltage (an accelerating voltage), and a current (a lens current) are used as the fluctuation factor data.

An air pressure is measured by a barometer 64a, digitally converted by an ADC (Analog to Digital Converter) 65a, and converted into a fluctuating correction coefficient by a coefficient converter 66a. Similarly, a temperature measured by a thermometer 64b and a voltage and a current measured by a voltmeter/ammeter 64c are digitally converted by the ADCs 65b and 65c and converted into fluctuating correction coefficients by the coefficient converters 66b and 66c, respectively.

These fluctuating correction coefficients are integrated by an integrator 67, and the integrated fluctuating correction coefficient is further integrated with the constant correction coefficient by an integrator 68. An integrated correction coefficient thus obtained is then inputted to the output correction computing unit 61.

In this way, the exposure data is corrected using the integrated correction coefficient considering both a correction coefficient measurable before exposure (a constant correction coefficient) and a correction coefficient which changes with an environmental change (a fluctuating correction coefficient). Accordingly, even after exposure data is corrected in calibration by using the constant correction coefficient and the fluctuating correction coefficient, the exposure data is further corrected using an integrated correction coefficient obtained by calculating fluctuating correction coefficients according to respective information pieces, such as an air pressure and a temperature, acquired after the calibration.

Figure 7:
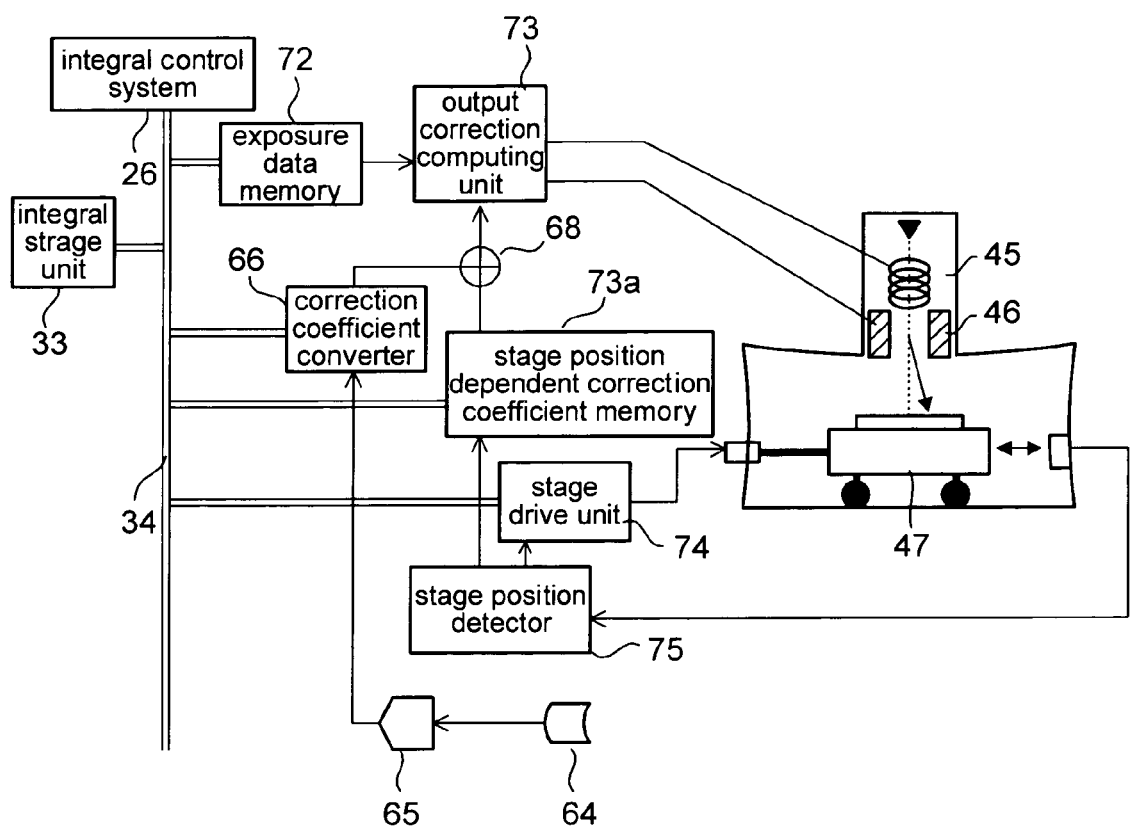
FIG. 7 is a block configuration diagram of main components for correcting writing accuracy degradation due to air pressure fluctuation.

FIG. 7 shows a block diagram of main components for correcting accuracy degradation due to air pressure fluctuation.

The integral storage unit 33, an exposure data memory 72, the correction coefficient converter 66, a stage position dependent correction coefficient memory 73, and a stage drive unit 74 are connected to the integration controller 26 through the bus 34.

A pattern for one shot to be transferred to the sample is extracted from exposure data stored in the integral storage unit 33 and inputted to the exposure data memory 72.

The output correction computing unit 73 receives the exposure data from the exposure data memory 72, and accordingly calculates a voltage signal to apply to the deflector 46 and a current signal to apply to the correction coil 45. In this calculation of the signals, the output correction computing unit 73 receives both the constant correction coefficient and the fluctuating correction coefficient and thus corrects the exposure data.

Regarding air pressure data measured by the barometer 64, the correction coefficient converter 66 calculates a fluctuating correction coefficient for the exposure data according to a difference between a standard air pressure and the measured air pressure. Note that relations between correction coefficients and differences between the standard air pressure and measured air pressures are measured in advance and stored in the integral storage unit 33, and the fluctuating correction coefficient is extracted from the integral storage unit 33 according to the measured air pressure data.

For example, a diaphragm barometer is used as the barometer 64. The diaphragm barometer measures an air pressure by forming, with diaphragms, a closed space having a certain internal gas, and electrically converting the movement of the diaphragms which changes due to air pressure fluctuation.

In FIG. 7, constant correction coefficients are stored in the stage position dependent correction coefficient memory 73a. As the stage position dependent correction coefficient, each constant correction coefficient for exposure data, which is needed for irradiating an irradiation position designated by the exposure data with an electron beam, is stored in a storage area specified using the irradiation position as an address. A relation between the irradiation position and the constant correction coefficient is calculated before exposure processing is performed.

The constant correction coefficients are calculated by a known method. For example, a wafer for detecting irradiation position errors is placed on a stage, a predetermined position on the wafer is irradiated with an electron beam by designating a coordinate on the wafer, and a shift between the position actually irradiated and the predetermined position is measured. Based on positional shifts of several predetermined coordinates, positional shifts for all the coordinates on the wafer are calculated. Then, constant correction coefficients for cancelling corresponding positional shifts are determined.

In addition, regarding selection of a CP pattern, selection errors are detected in advance, and each constant correction coefficient for exposure data, which is needed for selecting a CP pattern designated by the exposure data, is stored in a storage area specified using the position of the CP pattern to be selected as an address.

Note that an environment condition such as air pressure fluctuates with time also when the constant correction coefficient is calculated. Since the constant correction coefficient should not include factors dependent on such an environmental change, a fluctuating correction coefficient is used in calculating the constant correction coefficient to cancel a change amount dependent on the environmental change.

An exposure position is corrected using a constant correction coefficient for the exposure data specified in the stage position dependent correction coefficient memory 73a. To irradiate the exposure position thus corrected, the stage 47 is moved by controlling the stage drive unit 74, while a stage position reader 75 is caused to detect the position of the stage 47.

Note that the exposure data memory 72 corresponds to the column cell storage unit 35 in FIG. 3, and that the output correction computing unit 73 corresponds to the corrector 36 and the exposure data converter 37 in FIG. 3.

A description is given below of processing for correcting exposure data acquired from the exposure data memory 72 when the exposure data indicates, for example, (X0_def, Y0_def).

An air pressure measured at the point when the exposure data is acquired is inputted through the ADC 65 to the correction coefficient converter 66, which then outputs a fluctuating correction coefficient. Here, the fluctuating correction coefficient is extracted from the integral storage unit 33 storing fluctuating correction coefficients calculated in advance according to differences between measured air pressures and a standard air pressure. For example, assume that the fluctuating correction coefficient obtained is (Gx_prs, Ry_prs). A constant correction coefficient corresponding to the exposure data is extracted from the stage position dependent correction coefficient memory 73a. For example, assume that the constant correction coefficient is (Gx_pos, Py_pos). The exposure data is corrected using the constant correction coefficient and the fluctuating correction coefficient, whereby deflection efficiency of the deflector, namely, an input signal (X1_def, Y1_def) to the deflector corresponding to a beam deflection amount is calculated.

In an electrostatic deflector that deflects an electron beam to an irradiation position on a sample and includes X-direction and Y-direction electrodes, a voltage applied to the X-direction electrode is represented by Formula (1), and a voltage applied to the Y-direction electrode is represented by Formula (2).

$$X1\_def = X0\_def \times (Gx\_pos + Gx\_prs) + Y0\_def \times (Rx\_pos + Rx\_prs) + (Ox\_pos + Ox\_prs) \quad (1)$$

$$Y1\_def = Y0\_def \times (Gy\_pos + Gy\_prs) + X0\_def \times (Ry\_pos + Ry\_prs) + (Oy\_pos + Oy\_prs) \quad (2)$$

Voltages proportional to Formulae (1) and (2) are applied to the electrodes of the electrostatic deflector, respectively, and thus the electron beam is deflected. In these formulae, Gx_pos+Gx_prs and Gy_pos+Gy_prs indicate gain correction coefficients, Rx_pos+Rx_prs and Ry_pos+Ry_prs indicate rotation correction coefficients, and Ox_pos+Ox_prs and Oy_pos+Oy_prs indicate offset adjustment coefficients. Further, *_pos indicates a constant correction coefficient for a component dependent on the stage position (sample exposure position), and *_prs indicates a fluctuating correction coefficient for a component dependent on an air pressure.

In each column cell, electron-beam irradiation is performed by deflecting an electron beam with an amount of voltage corrected based on these values.

Air pressure fluctuation causes a change in the focus of an electron beam. To correct the focus, focus correction intensity, namely, an input signal Fout to the focus corrector corresponding to a beam focus is calculated by Formula (3).

$$Fout = fpos + fprs \quad (3)$$

Here, fpos indicates a constant correction coefficient for a component dependent on the stage position (sample exposure position), and fprs indicates a fluctuating correction coefficient dependent on an air pressure.

Usually, the focus of an electron beam is detected as follows. Specifically, a reference mark formed on a sample is scanned while a focus position is changed by changing a current flowing through the coil of the electromagnetic lens. Then, a focus with the sharpest signal change observed in reflected-electron detection by a detector is set as an optimal focus. The focus is adjusted by adding or subtracting the amount of air pressure fluctuation obtained by formula (3) to or from a value of current to supply to the coil.

As described thus far, in the present embodiment, the electron beam exposure apparatus takes a correction coefficient independent of time passage (a constant correction coefficient) and a correction coefficient which changes with time (a fluctuating correction coefficient) into consideration in correcting exposure data. Specifically, exposure data is corrected during the execution of exposure processing by using an integrated correction coefficient of the constant correction coefficient and the fluctuating correction coefficient. The constant correction coefficient is a correction coefficient according to the sample exposure position or, in the case of character projection, the position of a CP pattern. The fluctuating correction coefficient is a correction coefficient determined according to, for example, fluctuation in air pressure or temperature around the apparatus.

By cancelling irradiation position fluctuation due to air pressure fluctuation or temperature fluctuation by using the fluctuating correction coefficient, electron-beam irradiation can be performed with high accuracy continuously for a long time after execution of calibration.

Although an air pressure is mainly described as a disturbance affecting the position of beam irradiation in the above description, other factors (e.g., a change in a temperature or an accelerating voltage) need to be constant in order to make the relationship between the air pressure fluctuation and an irradiation position shift due to that fluctuation constant.

Accordingly, the air pressure fluctuation and the irradiation position shift are detected in an environment where other factors are constant. When it is difficult to make the other factors constant, acceptable fluctuation ranges are determined for the other factors, and environmental data, such as an air pressure and a temperature, which are factors of a beam irradiation position shift are recorded. A relation between an air pressure and an irradiation position is extracted from a range where the fluctuations of factors other than the air pressure are within the respective acceptable fluctuation ranges. A correspondence between temperature fluctuation and irradiation position fluctuation is obtained similarly. Specifically, a relation between a temperature and irradiation position fluctuation is extracted from a range where the fluctuations of factors other than the temperature are within the respective predetermined acceptable fluctuation ranges.

In addition, although one of the multiple column cells of the multi-column exposure apparatus is described in the above description, each column cell of the multiple column cells is thought to be affected differently by an air pressure, a temperature, an accelerating voltage, or the like. Accordingly, the fluctuating correction coefficient is calculated for each column cell. Further, the present invention is of course applicable not only to the multi-column electron beam exposure apparatus, but also to an electron beam exposure apparatus with a single column.

(Electron Beam Exposure Method)

Next, an exposure method in the above-described electron beam exposure apparatus is described.

Figure 8:
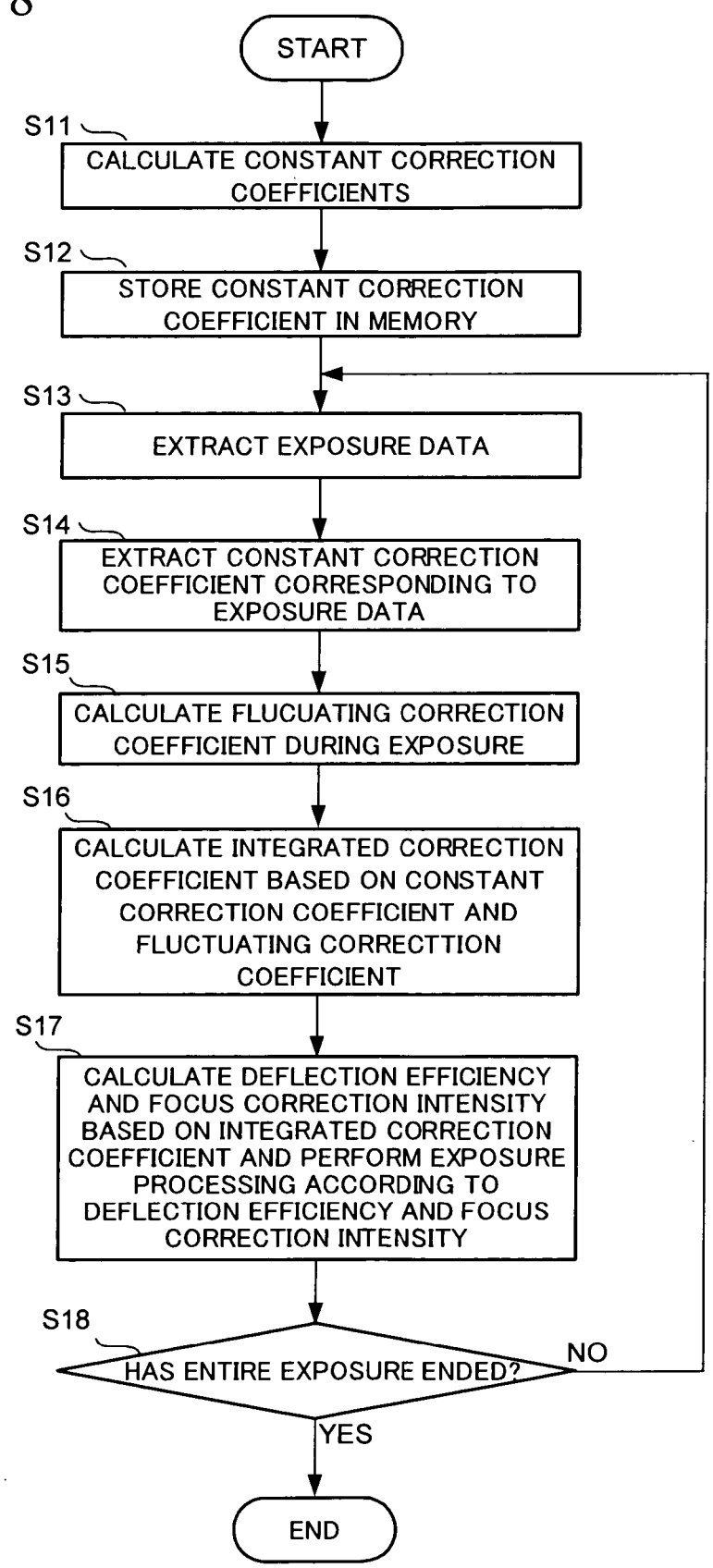
FIG. 8 is a flowchart showing an example of the exposure processing including processing for correcting the exposure data.

FIG. 8 is a flowchart showing an example of electron beam exposure processing.

First, in a stage prior to exposure processing (writing processing), in Step S11 constant correction coefficients are measured, and in Step S12 the constant correction coefficients are stored in a memory according to the position of a stage on which a write target sample is mounted or the position of a CP pattern. Specifically, each constant correction coefficient for exposure data, which is needed for irradiating an irradiation position designated by the exposure data with an electron beam or for selecting a CP pattern, is stored in a storage area specified using, as an address, the position of a stage on which a write target sample is mounted or the position of a CP pattern.

The actual exposure processing starts from next Step S13. In Step S13, exposure data for one shot is extracted from the exposure data stored in the integral storage unit 33.

In next Step S14, an irradiation position specified in the exposure data thus extracted is referred to and used as an address for searching the stage position dependent correction coefficient memory 73a and the constant correction coefficient stored in a storage area specified by the address is extracted.

In next Step S15, a fluctuating correction coefficient is calculated. An air pressure value, which is one of fluctuation factors during exposure, is inputted from a barometer, and a fluctuating correction coefficient which corresponds to the air pressure value is acquired. Specifically, relations between fluctuating correction coefficients and differences between a standard air pressure and measured air pressures are determined in advance and stored in the integral storage unit 33. Then, the fluctuating correction coefficient is extracted from the integral storage unit 33 according to the measured air pressure data. The fluctuation factors are not limited to the air pressure, but include a temperature, an acceleration voltage of the apparatus, and the like. A final fluctuating correction coefficient is obtained by unifying the fluctuating correction coefficients specified for all of these respective factors.

In next Step S16, an integrated correction coefficient is calculated by unifying the constant correction coefficient obtained in Step S14 and the fluctuating correction coefficient obtained in Step S15 through addition or subtraction.

In next Step S17, deflection efficiency of the deflector and focus correction intensity of the focus corrector are calculated based on the integrated correction coefficient calculated in Step S16, and are then sent to the deflector and the focus corrector. The exposure processing is performed according to these signals thus corrected.

In next Step S18, whether the entire exposure processing has ended or not is determined. If the entire exposure processing has not ended yet, the processing returns to Step S13 to continue to perform the exposure processing, and if the entire exposure processing has already ended, this processing ends.

As described, in the electron beam exposure method of the present embodiment, prior to the exposure processing, correction coefficients independent of time passage are calculated, and relations between irradiation positions and the correction coefficients or relations between selected CP patterns and the correction coefficients are stored in the storage unit in advance. Thereafter, exposure data is corrected during the exposure processing by taking into consideration a correction coefficient independent of time passage (a constant correction coefficient) and a correction coefficient which changes with time (a fluctuating correction coefficient). Specifically, the exposure data is corrected using an integrated correction coefficient obtained through addition or subtraction of the constant correction coefficient and the fluctuating correction coefficient. The constant correction coefficient is a correction coefficient according to the write position on a sample or, in the case of character projection, the position of a CP pattern. The fluctuating correction coefficient is a correction coefficient determined according to fluctuation in, for example, air pressure or temperature around the apparatus.

By cancelling irradiation position fluctuation due to air pressure fluctuation or temperature fluctuation by using the fluctuating correction coefficient, electron-beam irradiation can be performed with high accuracy continuously for a long time after execution of calibration.

What is claimed is:

1. An electron beam lithography apparatus including: a sample chamber having a wafer stage on which a write target sample is placed; and an electron beam optical barrel configured to irradiate the sample with an electron beam, the electron beam lithography apparatus comprising:
   an electron gun configured to emit the electron beam;
   a deflector configured to deflect the electron beam;
   a focus corrector configured to correct a focus of the electron beam;
   a stage position dependent correction coefficient memory configured to store a constant correction coefficient, which is determined according to a write position on the sample or a position of a character projection (CP) pattern to be selected and independent of time passage, and which is stored in a storage area to be specified by an address of the write position on the sample or the position of the CP pattern;
   a measurer configured to measure fluctuation factor data of a factor affecting operation of the electron beam lithography apparatus;
   a coefficient converter configured to determine the fluctuation correction coefficient according to a value of the fluctuation factor data measured by the measurer;
   an integral storage unit configured to store exposure data and store a correspondence between the value of the fluctuation factor data and the fluctuating correction coefficient;
   an integrator configured to calculate the integrated correction coefficient according to integration of the constant correction coefficient and the fluctuating correction coefficient; and
   an output correction computing unit configured to correct the exposure data based on the integrated correction coefficient, thereby calculating a deflection efficiency indicating a relation between an input signal to the deflector and an amount of beam deflection, and a focus correction intensity indicating a relation between an input signal to the focus corrector and a beam focus, and to write the electron beam on the sample according to the deflection efficiency and the focus correction intensity.

2. The electron beam lithography apparatus according to claim 1, wherein the controller extracts the constant correction coefficient corresponding to an irradiation position designated in the exposure data, extracts the fluctuating correction coefficient according to the fluctuation factor data measured by the measurer, calculates a correction coefficient for the exposure data through addition or subtraction of the constant correction coefficient and the fluctuating correction coefficient, and thus calculates the deflection efficiency and the focus correction intensity.

3. The electron beam lithography apparatus according to claim 2, wherein
   the measurer is at least one of a barometer, a thermometer, a voltmeter, and an ammeter, and
   the fluctuation factor data is at least one of an air pressure value measured by the barometer, a temperature measured by the thermometer, an accelerating voltage value measured by the voltmeter, and a lens current value measured by the ammeter.

4. The electron beam lithography apparatus according to claim 1, comprising a plurality of the electron beam optical barrels.

5. An electron beam lithography method in an electron beam lithography apparatus including:
   an electron gun configured to emit an electron beam, a deflector configured to deflect the electron beam, a focus corrector configured to correct a focus of the electron beam, a stage position dependent correction coefficient memory configured to store a constant correction coefficient, which is determined according to a write position on the sample or a position of a character protection (CP) pattern to be selected and independent of time passage, and which is stored in a storage area to be specified by an address of the write position on the sample or the position of the CP pattern;
   a measurer configured to measure fluctuation factor data of a factor affecting operation of the electron beam lithography apparatus;
   a coefficient converter configured to determine the fluctuation correction coefficient according to a value of the fluctuation factor data and the fluctuating correction coefficient;
   an integrator configured to calculate the integrated correction coefficient according to integration of the constant correction coefficient and the fluctuating correction coefficient;
   an integral storage unit configured to store exposure data and store a correspondence between the value of the fluctuation factor data and the fluctuating correction coefficient; and
   an output correction computing unit configured to correct the exposure data based on the integrated correction coefficient, thereby calculating a deflection efficiency indicating a relation between an input signal to the deflector and an amount of beam deflection, and a focus correction intensity indicating a relation between an input signal to the focus corrector and a beam focus,
   the electron beam lithography method comprising the following steps of:
      before starting writing, measuring a constant correction coefficient for the exposure data and storing the constant correction coefficient in the stage position dependent correction coefficient memory, the constant correction coefficient being independent of time passage;
      extracting exposure data from the integral storage unit;
      extracting from the stage position dependent correction coefficient memory a constant correction coefficient corresponding to the exposure data extracted;
      calculating the fluctuating correction coefficient for the exposure data during the writing, the fluctuating correction coefficient changing with time;
      calculating a deflection efficiency of the deflector and a focus correction intensity of the focus corrector based on the constant correction coefficient and the fluctuating correction coefficient; and
      after the foregoing steps, exposing the sample with the electron beam incorporating the deflection efficiency and the focus correction intensity.

6. The electron beam lithography method according to claim 5, wherein
   the constant correction coefficient is determined according to a write position on the sample or a position of a character projection (CP) pattern to be selected, and is stored in a storage area of the stage position dependent correction coefficient memory, the storage area being specified by an address of the write position on the sample or the position of the CP pattern, the fluctuating correction coefficient is determined according to a value of fluctuation factor data measured by a measurer configured to measure fluctuation factor data of a factor affecting operation of the electron beam lithography apparatus, and the storage unit stores a correspondence between the value of the fluctuation factor data and the fluctuating correction coefficient.

* * * * *